(12) United States Patent
Petchenev et al.

(10) Patent No.: US 7,064,556 B2
(45) Date of Patent: Jun. 20, 2006

(54) FREQUENCY RECTIFICATION TOOL FOR SHORTER WAVEFORMS

(75) Inventors: Alexei Petchenev, Carson City, NV (US); Olga Malakhova, Minden, NV (US); John W. Grant, Gardnerville, NV (US); Nathan B. Littrell, Garnerville, NV (US)

(73) Assignee: General Electric Co., Erie, PA (US)

( * ) Notice: Subject to any disclaimer, the term of this patent is extended or adjusted under 35 U.S.C. 154(b) by 0 days.

(21) Appl. No.: 10/838,459

(22) Filed: May 4, 2004

(65) Prior Publication Data

US 2005/0248354 A1    Nov. 10, 2005

(51) Int. Cl.
*G01R 29/26* (2006.01)

(52) U.S. Cl. ............................ 324/613; 324/76.19

(58) Field of Classification Search ........ 324/76.11, 324/76.12, 76.19, 76.27, 76.28, 613; 331/78; 375/334
See application file for complete search history.

(56) References Cited

U.S. PATENT DOCUMENTS

| | | | | |
|---|---|---|---|---|
| 4,530,056 A | * | 7/1985 | MacKinnon et al. | 701/25 |
| 5,034,714 A | * | 7/1991 | Bratkowski et al. | 335/234 |
| 5,365,787 A | * | 11/1994 | Hernandez et al. | 73/660 |
| 6,822,522 B1 | * | 11/2004 | Brown et al. | 331/135 |
| 2003/0210734 A1 | * | 11/2003 | Kaku | 375/148 |
| 2005/0200378 A1 | * | 9/2005 | Hobelsberger et al. | 324/772 |

* cited by examiner

*Primary Examiner*—Walter Benson
(74) *Attorney, Agent, or Firm*—Polster, Lieder, Woodruff & Lucchesi, LC

(57) ABSTRACT

A method of detecting a signal (S) of interest contained within a waveform (F) comprised of a plurality of signals within a frequency spectrum, as well as random noise. After first detecting the waveform, a determination is made as to whether the duration (Td) of the waveform is sufficient for subsequent processing. If the duration is not sufficient, the waveform is concatenated with itself to produce a waveform of sufficient duration. The concatenated waveform is then processed and the results supplied as an input to an oscillator (24) operating at a nominal output frequency. The oscillator cancels the effects of noise in the waveform and the frequency of the oscillator shifts to a different frequency which is a function of the signal of interest. The shift in output frequency of the oscillator is detected and analyzed to obtain the signal of interest. The oscillator can be either a general purpose oscillator or a Van der Pol oscillator.

22 Claims, 2 Drawing Sheets

FREQUENCY RECTIFICATION TOOL FOR SHORTER WAVEFORMS

CROSS-REFERENCE TO RELATED APPLICATIONS

None.

STATEMENT REGARDING FEDERALLY SPONSORED RESEARCH OR DEVELOPMENT

Not Applicable.

BACKGROUND OF THE INVENTION

This invention relates to signal processing techniques; and more particularly, to the extraction of a sinusoidal waveform from a "noisy" signal.

In some troubleshooting applications; for example, in fault investigation of electric motors, it is often necessary to evaluate signals obtained as part of the troubleshooting process in order to determine the cause of a problem. In an electric motor, these problems may include broken rotor bars, or a turn-to-turn electrical short. During signal processing, the frequency of a signal of interest can be evaluated as a component of a major Fourier transformation. Further, while a particular frequency of interest might not be the major Fourier component, over all of a frequency range, the component may well be the highest amplitude signal component within a particular frequency band. Sometimes it is possible to initially select a frequency band sufficiently narrow so the frequency of interest is the major component within that narrow range of frequencies. On the other hand, many times the signal is so noisy that even if an evaluation can be attempted within a frequency band within close proximity to a signal of interest, the random noise present within the band may be significantly higher than the amplitude of the signal of interest. The result is that the signal of interest is obscured by the noise and cannot be readily identified or processed as part of troubleshooting the problem. Rather, the noise renders any meaningful search ineffective, at best yielding only a random result which is not helpful at all.

Further affecting the situation is the condition that the waveform of interest is often only of a short duration. This makes it difficult to capture the signal so it can be made available for analysis. Using conventional signal processing techniques for shorter waveforms, such as are known to those skilled in the art, a frequency of interest can sometimes be identified and recovered. One such method for detecting a specific frequency component within a signal spectrum requires that the signal be filtered to be within a desired frequency band that includes the frequency of interest. If the signal is then either the only significant component within the band, or a major component within the band, the signal can now be detected and processed.

The above described technique usually only works, however, if there is little or no noise in the filtered frequency band. More often, the peak amplitude of the signal of interest is too small when compared with the noise within the band and is buried too deeply within the noise to be extracted. In these situations, even if the researcher is within very close proximity to the signal that needs to be identified, the amplitude peaks in the frequency spectrum being investigated will be noise peaks rather than signal peaks and the signal of interest will remain hidden. The result is that other troubleshooting techniques have to be employed to identify the cause of the problem.

BRIEF SUMMARY OF THE INVENTION

Briefly stated, the present invention is directed to a method for use with short duration waveforms to recover a signal of interest which occurs within a defined frequency spectrum. The method allows the signal that is buried within the spectrum to be readily extracted so that it can be used to identify, for example, the source of a problem in an electric motor. The method is effective regardless of whether the signal is being investigated in the time domain and or in the frequency domain.

A waveform including a signal of interest is first detected, captured, and stored. Next, the stored waveform is processed by a processor whose output is provided as an input to an oscillator. The oscillator is configured to initially generate a specified frequency output which is preferably close to the frequency of the signal of interest. In response to the input from the processor, the frequency produced by the oscillator is now shifted from this pre-selected or initial frequency to a new frequency which includes a sinusoidal component of the signal being investigated. Importantly, noise in the processed, stored waveform is transparent to the oscillator and the output frequency of the oscillator does not significantly change in response to the noise. The shifted frequency output of the oscillator is supplied to a spectrum analyzer to ascertain the frequency of the underlying signal component previously hidden in the noise. Once the signal is identified, it can then be further evaluated for trouble shooting purposes.

If the signal of interest is of such a short duration that insufficient information about the signal can be derived about it when the waveform is processed by the processor, the method of the invention includes having the waveform concatenated with itself a number of times. This enables a sufficient amount of data to be acquired and processed so the input to the oscillator is sufficient to obtain a frequency shift the oscillator is configured to produce. Both a general type oscillator or a Van der Pol type oscillator is used in accordance with the method of the invention to obtain the frequency shift in response to an input from the processor.

The foregoing and other objects, features, and advantages of the invention will be in part apparent and in part pointed out hereinafter.

BRIEF DESCRIPTION OF THE SEVERAL VIEWS OF THE DRAWINGS

In the accompanying drawings which form part of the specification.

DESCRIPTION OF THE PREFERRED EMBODIMENT

The following detailed description illustrates the invention by way of example and not by way of limitation. The description clearly enables one skilled in the art to make and use the invention, describes several embodiments, adaptations, variations, alternatives, and uses of the invention, including what is presently believed to be the best mode of carrying out the invention.

Figure 1:
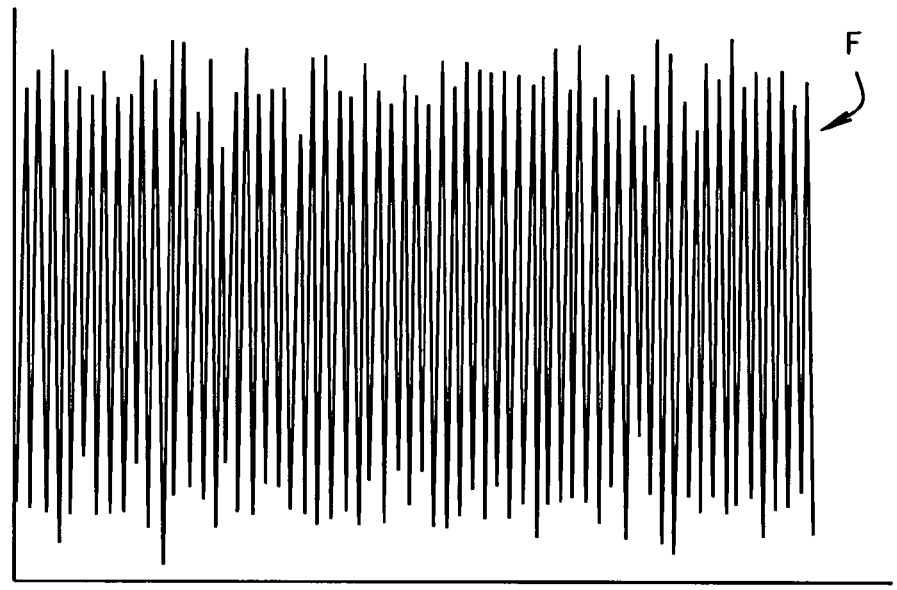
FIG. 1 illustrates a frequency spectrum waveform in which is included a signal of interest which is to be investigated.
Figure 3:
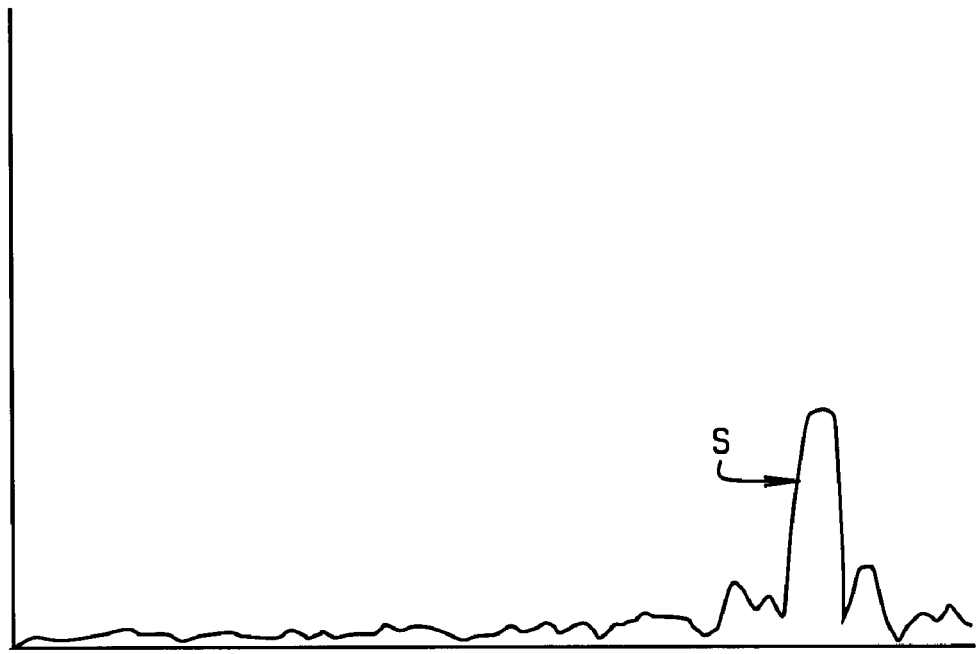
FIG. 3 illustrates the signal recovered from the frequency spectrum through use of the method; and, FIG. 4 illustrates concatenation of the waveform in order to provide a waveform of a requisite length for obtaining the desired signal.

The method of the present invention is directed to signal-processing, particularly a method for identifying or uncovering a signal S of interest (see FIG. 3) within a spectrum of frequencies F (see FIG. 1) which includes the signal. As is understood by those skilled in the art, waveform F is a complex, analog waveform including a number of base frequencies, and the harmonic components of these base frequencies, as well as random noise. Typically, signal S is a harmonic signal buried in the noise of waveform F and it is not possible to readily recover the signal from the noise using traditional signal recovery techniques. As further described herein, the method of the invention is also particularly useful when waveform S is a waveform of short duration.

Figure 2:
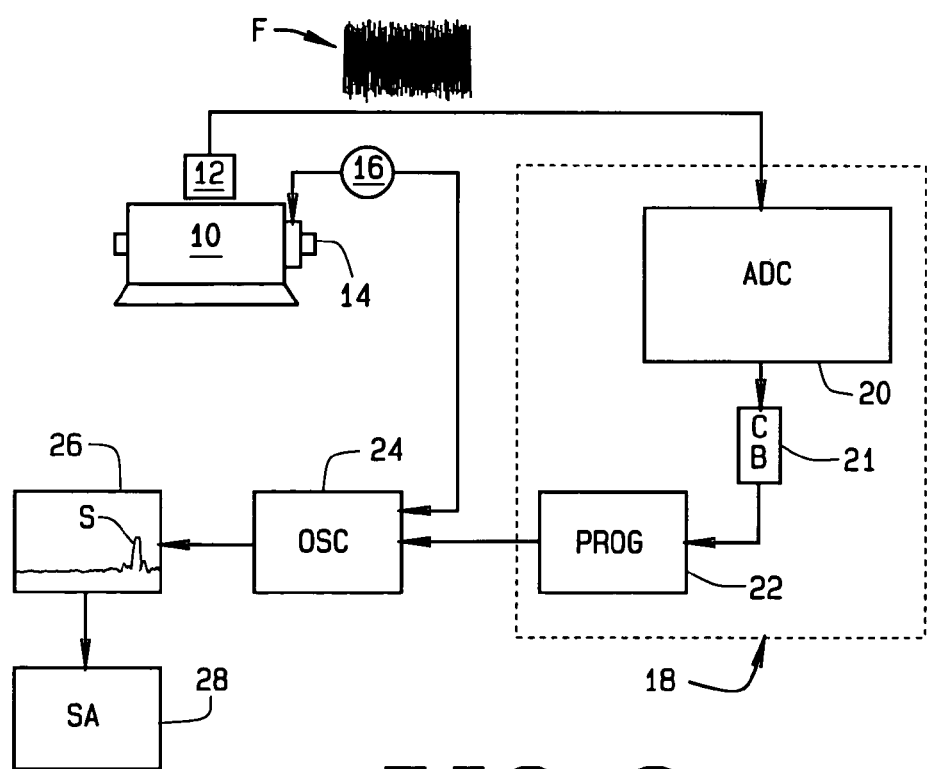
FIG. 2 is a block diagram illustrating the method of the present invention for identifying the signal.

Referring to FIG. 2, and by way of example, an electric motor 10 experiencing a problem is to be investigated to determine what may be causing the motor to not function properly. Motor faults such as broken rotor bars or turn-to-turn shorts can be identified using the process of the invention. The process of the invention utilizes a spectral analysis of the electric current waveforms F produced by the motor. As shown in FIG. 2, waveforms F are obtained, for example, using a relay 12 such as a MULTILIN® universal relay manufactured by the General Electric Corporation (GE). In particular, a GE model UR M-60 or UR 469 universal relay is used to obtain the waveform.

In addition to capturing the waveform, it is also useful to know the speed of rotation of the motor shaft 14. This information is acquired using a tachometer 16 as shown in FIG. 2. If a tachometer is not available, then the frequency of shaft rotation can be determined from an analysis of waveform F. As noted, however, the waveform typically includes a significant amount of noise.

Figure 4:
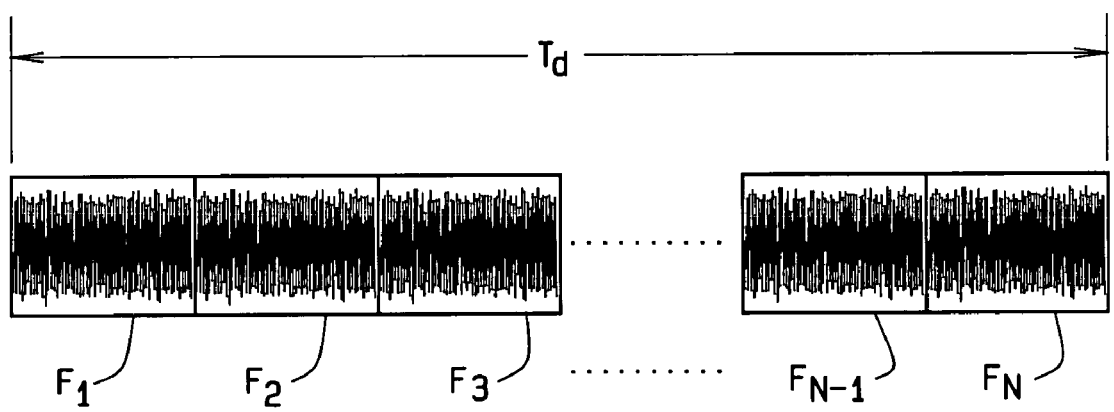

After waveform F is obtained, it is supplied to a processor indicated generally 18. The waveform is first converted from an analog to a digital signal using an analog-to-digital converter (ADC) module 20. Those skilled in the art will understand that module 20 can be implemented using software. It often occurs that the frequency spectrum waveform in which signal S is contained is of a very short duration, and as such, insufficient information can be gleaned from the waveform to detect the signal. It is a feature of the method of the invention, as shown in FIG. 4, that when waveform F is determined to not be of sufficient duration, the waveform is appended to (concatenated with) itself a number of times such that a waveform of sufficient length is produced. After the waveform is first digitized, it is supplied to a concatenation module (CON) 21 where the duration of the waveform is determined and compared against a baseline duration required to produce signal S. If it determined that the waveform is sufficiently long, the digitized waveform is supplied to a programming module (PROG) 22 which formats the waveform for use with an oscillator (OSC) 24 as described hereafter. If, however, module 21 determines that the waveform is too short in duration, then the waveform is appended to itself "n" times, "n" being the number of times concatenation is required to obtain a waveform of sufficient duration. It will be understood by those skilled in the art that the number of concatenations required will vary from one application to another, but that when completed, the resulting concatenated waveform will have a duration Td which is the minimum duration necessary to achieve the desired results from use of the method.

In accordance with the invention, the method can be performed using either a general type oscillator, or a Van der Pol type oscillator. Because those skilled in the art are familiar with oscillators and their set-up and operation, they will not be described in detail. The primary difference between the two types of oscillators is that while both general and Van der Pol type oscillators generate waveforms close to a sinusoidal shape, a Van der Pol oscillator exhibits certain specific non-linear behavior which is useful in applications involving electric current waveforms. Both type oscillators are employed for the same reason; to recover signal S from waveform F, even if the signal is completely buried under noise both in the time and frequency domains. Regardless of the type of oscillator used, the oscillator initially operates to generate an output signal (oscillations) of a predetermined, nominal frequency. This frequency is, in part, determined by the output from tachometer 16, since the frequency of signal S will generally be close to that measured by the tachometer. For example, if the frequency of signal S is estimated to be 59 Hz, the operating frequency of oscillator 24 may be set at 60 Hz based upon the reading of tachometer 16.

An output from processor 18 is applied as an input to the oscillator. Oscillator 24 now adjusts the frequency of its signal output in response to the input from the processor. A detector 26 is responsive to the signal output from the oscillator to sense any change in the frequency of oscillations produced. An output from the detector is then supplied to a signal analyzer (SA) 28 to produce the signal S. The significance of providing oscillator 24 with an input derived from the processing of waveform F is that because the noise component of the waveform is random, any shift in the output frequency of the oscillator, due to the noise component of the waveform, will tend to be canceled out because any frequency shifting will be to both sides of the nominal oscillator frequency. Consequently, the overall shift in the output frequency of oscillator 24 will be caused by the signal S under investigation.

In view of the above, it will be seen that the several objects of the invention are achieved and other advantageous results are obtained. As various changes could be made in the above constructions without departing from the scope of the invention, it is intended that all matter contained in the above description or shown in the accompanying drawings shall be interpreted as illustrative and not in a limiting sense.

The invention claimed is:

1. A method of detecting a signal (S) of interest contained within a waveform (F) comprised of a plurality of frequencies within a frequency spectrum, as well as random noise, comprising:

capturing the waveform starting at any instant of time;
   converting the waveform from analog to digital;
   processing the digitized waveform; and,
   supplying results of the processing as an input to an oscillator (24) using dynamic synchronization, the oscillator operating at a nominal output frequency which is near that of the signal of interest, the oscillator canceling the effects of the noise in the waveform and shifting its output frequency to a different frequency which is a function of the signal of interest.

2. The method of claim 1 further including detecting the output frequency of the oscillator and analyzing the shift in frequency to detect the signal of interest.

3. The method of claim 1 further including determining if the duration (Td) of the waveform is sufficient for the oscillator to respond to the input to shift its output frequency to that of the signal of interest.

4. The method of claim 3 further including concatenating the waveform with itself a sufficient number of times to produce a waveform of sufficient duration.

5. The method of claim 3 wherein capturing the waveform includes applying the waveform to a universal relay (12).

6. The method of claim 5 further including converting an output from the universal relay from an analog to a digital waveform.

7. The method of claim 6 in which the digitized waveform is concatenated to produce of waveform of sufficient duration for use with the oscillator.

8. The method of claim 1 in which the oscillator is a general purpose oscillator.

9. The method of claim in 1 which the oscillator is a Van der Pol oscillator.

10. Apparatus for detecting a signal (S) of interest contained within a waveform (F) comprised of a plurality of frequencies within a frequency spectrum, as well as random noise, comprising:
    means (12) for capturing the waveform starting at any instant of time;
    means (20) converting the waveform from analog to digital;
    means (22) processing the digitized waveform; and,
    means for supplying results of the processing as an input to an oscillator (24) using dynamic synchronization, the oscillator (24) operating at a nominal output frequency which is near that of the signal of interest to which the processed digitized waveform is supplied as an input, the oscillator canceling the effects of the noise in the waveform and shifting its output frequency to a different frequency which is a function of the signal of interest.

11. The apparatus 10 in which the oscillator is a general purpose oscillator.

12. The apparatus 10 in which the oscillator is a Van der Pol oscillator.

13. The apparatus of claim 10 further including means (26, 28) detecting the output frequency of the oscillator and analyzing the shift in frequency to detect the signal of interest.

14. The apparatus of claim 10 further including concatenating means (21) determining if the duration (Td) of the waveform is sufficient for the oscillator to respond to the input to shift its output frequency to that of the signal of interest.

15. The apparatus of claim 14 wherein, if the duration of the waveform is insufficient, the concatenating means appends the waveform with itself a sufficient number of times to produce a waveform of that is of a sufficient duration.

16. The apparatus of claim 10 wherein the means (12) for capturing the waveform includes a universal relay.

17. A method of detecting a signal (S) of interest contained within a waveform (F) comprised of a plurality of frequencies within a frequency spectrum, as well as random noise, comprising:
    detecting the waveform starting at any instant of time;
    determining if the duration (Td) of the waveform is of a sufficient duration for subsequent processing;
    if the duration of the waveform is of insufficient duration, concatenating the waveform with itself to produce a waveform of sufficient duration; and,
    processing the concatenated waveform and supplying results of the processing as an input to an oscillator (24) using dynamic synchronization, the oscillator operating at a nominal output frequency which is near that of the signal of interest, the oscillator canceling the effects of the noise in the waveform and shifting its output frequency to a different frequency which is a function of the signal of interest.

18. The method of claim 17 in which the oscillator is a general purpose oscillator.

19. The method of claim 17 in which the oscillator is a Van der Pol oscillator.

20. The method of claim 17 further including detecting the output frequency of the oscillator and analyzing the shift in frequency to detect the signal of interest.

21. The method of claim 20 further including operating the oscillator at a frequency near that of the signal of interest.

22. The method of claim 21 wherein capturing the waveform includes applying the waveform to a universal relay (12).

* * * * *